United States Patent
Payne et al.

(10) Patent No.: US 6,624,670 B2
(45) Date of Patent: Sep. 23, 2003

(54) HIGH SPEED VOLTAGE MODE DIFFERENTIAL DIGITAL OUTPUT DRIVER WITH EDGE-EMPHASIS AND PRE-EQUALIZATION

(75) Inventors: Robert F. Payne, Plano, TX (US); Chung San Roger Chan, Coppell, TX (US); Samuel M. Palermo, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 72 days.

(21) Appl. No.: 10/098,046

(22) Filed: Mar. 14, 2002

(65) Prior Publication Data

US 2002/0135404 A1 Sep. 26, 2002

Related U.S. Application Data

(60) Provisional application No. 60/277,505, filed on Mar. 21, 2001.

(51) Int. Cl.$^7$ .............................. H03B 1/00; H03K 3/00
(52) U.S. Cl. ...................... 327/108; 327/112; 327/170; 326/83
(58) Field of Search ................. 327/108–112, 379–381, 327/389, 391, 170, 423, 424, 588, 538–541, 543, 134, 263, 264; 326/24, 27, 30, 83, 86, 115; 323/313, 314, 315

(56) References Cited

U.S. PATENT DOCUMENTS

| 5,757,225 A | * | 5/1998 | Tobita | 327/539 |
| 6,111,431 A | * | 8/2000 | Estrada | 326/83 |
| 6,292,028 B1 | * | 9/2001 | Tomita | 326/86 |

FOREIGN PATENT DOCUMENTS

JP          200-68813 A    *   3/2000

* cited by examiner

*Primary Examiner*—Long Nguyen
(74) *Attorney, Agent, or Firm*—Alan K. Stewart; W. James Brady, III; Frederick J. Telecky, Jr.

(57) ABSTRACT

A differential driver includes two feedback loops 20 and 22, and two inverter pairs 24 and 26. The two feedback loops 20 and 22 regulate the source voltages for the two inverter pairs 24 and 26 to the reference voltages $V_{REFHI}$ and $V_{REFLO}$. The two inverter pairs 24 and 26 switch the output load $R_L$ and $C_L$ between the two regulated voltages in response to the input voltages IN+ and IN−. The reference voltages $V_{REFHI}$ and $V_{REFLO}$ are created by a reference cell and set the output high and low voltages.

14 Claims, 3 Drawing Sheets

HIGH SPEED VOLTAGE MODE DIFFERENTIAL DIGITAL OUTPUT DRIVER WITH EDGE-EMPHASIS AND PRE-EQUALIZATION

This application claims priority under 35 USC §119 (e) (1) of provisional application No. 60/277,505 filed Mar. 21, 2001.

FIELD OF THE INVENTION

This invention generally relates to electronic systems and in particular it relates to high speed voltage mode differential digital output drivers.

BACKGROUND OF THE INVENTION

Output drivers used in high speed serial data communication systems must drive non-ideal channels that have a high load capacitance and attenuate high frequency information. A well designed driver must be capable of driving data with short rise and fall times under conditions of high load capacitance. In addition, it is beneficial for the driver to provide a method of pre-equalizing the transmit data to boost the high frequency content of the data to compensate for the channel attenuation.

Most prior art high-speed output data drivers implemented in CMOS use current-mode logic (CML) outputs or a source-follower output. CML, although using standard CMOS, has output rise and fall times set by the external or internal load resistance and capacitance since the CML driver is high impedance. CML outputs must also be terminated with a DC path to a power supply, which limits the range of output common-mode voltage and requires double terminating when AC-coupling is employed. CML output drivers are not suitable for very high data rate applications where load capacitance is significant because the resultant rise and fall times are significant when compared to a bit interval. A source-follower cannot provide the high signal swings since its maximum output is limited to the supply voltage minus the threshold voltage minus the saturation voltage of the source follower transistor. For high signal swings where large currents are required, the saturation voltage is significant and greatly reduces the maximum voltage drive. The threshold voltage also increases above its nominal value for a source follower because of the body effect. Source-followers also do not have symmetric rise and fall times and do not provide an easy technique for signal pre-equalization. Other high-speed prior art solutions are implemented using bipolar technologies such as a BiCMOS or SiGe process, or more exotic processes such as GaAs.

SUMMARY OF THE INVENTION

A differential driver consists of two feedback loops, and two inverter pairs. The two feedback loops regulate the source voltages for the two inverter pairs to two reference voltages. The two inverter pairs switch the output load $R_L$ and $C_L$ between the two regulated voltages in response to the input voltages. The reference voltages are created by a reference cell and set the output high and low voltages to be largely independent of process variations. Two additional circuits detect whenever a transition occurs in the output data. When there is a transition, a short duration pulse generates additional source and sink current at the outputs to reduce rise and fall times. A bit unit-interval pulse generator supplies extra current for an entire bit after a transition to pre-equalize the data prior to launch into a lossy medium.

DETAILED DESCRIPTION OF PREFERRED EMBODIMENTS

The preferred embodiment circuit of FIGS. 1–4 is used to transmit data at high data rates over lossy media using a standard CMOS process. The circuit controls the differential and common-mode output voltages and has short rise and fall times. In addition, the circuit pre-equalizes the transmitted data to overcome media dependent high-frequency signal loss that causes intersymbol interference.

There are many problems that must be solved to transmit digital data at high data rates in a lossy system. First, the transmitter should be differential for noise and EMI immunity. Next, the differential voltage swing and common-mode output voltage should be controlled to insure good signal integrity and to provide a basis for design of a differential receiver. The output rise and fall times should be short when compared to the unit interval (UI) of a single transmitted bit; this dictates that the driver must be capable of driving a large capacitive load without being bandwidth-limited. Finally, since the data is typically transmitted over a lossy transmission line, the transmitted data must be pre-equalized to account for the high-frequency losses of the transmission line to ensure good signal integrity at the receiver.

The preferred embodiment output driver circuit consists of several subcircuits. The solution includes a differential driver, shown in FIG. 1, using a switched voltage mode output; a voltage reference circuit, shown in FIG. 2, that sets the differential and common-mode output voltages; an edge emphasis circuit, shown in FIGS. 3 and 4, that reduces rise and fall times and increases the bandwidth; and a programmable signal pre-emphasis circuit, shown in FIG. 6, that boosts the high-frequency content of the transmitted data to offset the transmission line loss.

Differential Driver

Figures 1, 2:
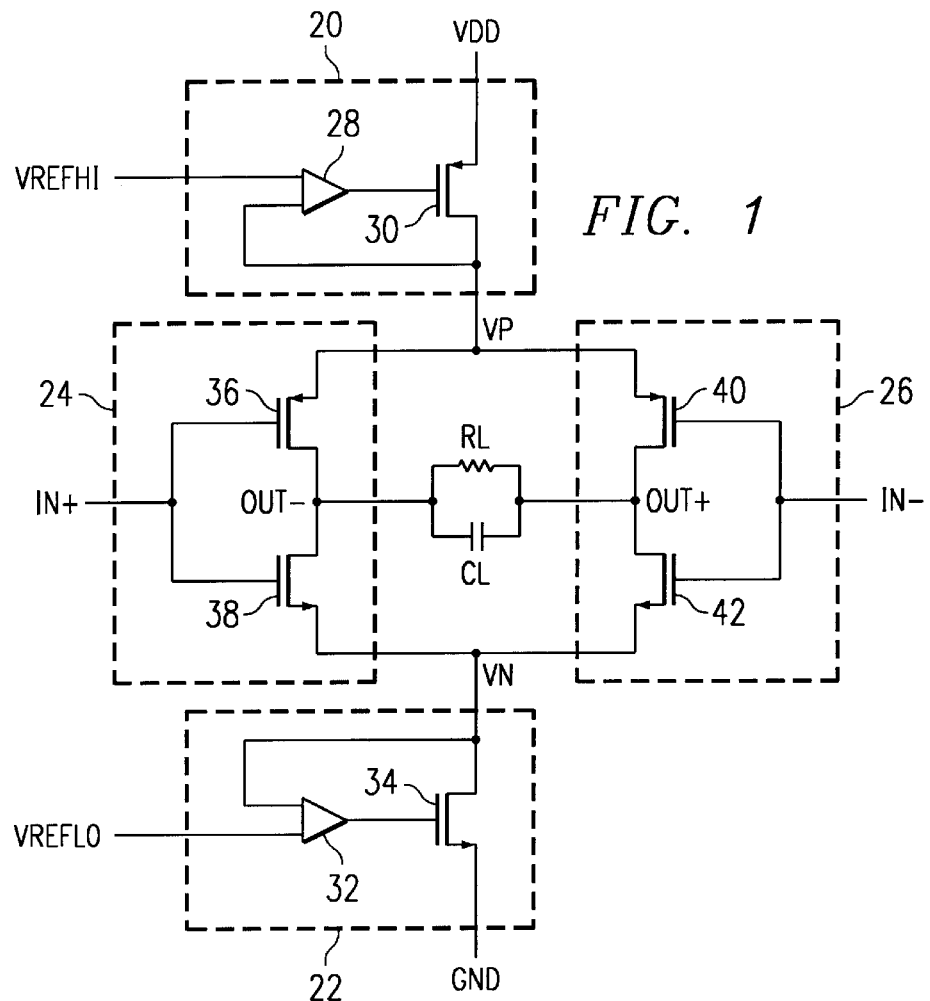
FIG. 1 is a schematic circuit diagram of a preferred embodiment differential driver circuit.
FIG. 2 is a schematic circuit diagram of a preferred embodiment voltage reference circuit.

The differential driver, shown in FIG. 1, consists of two feedback loops 20 and 22, and two inverter pairs 24 and 26. The two feedback loops 20 and 22 regulate the voltages at nodes $V_P$ and $V_N$ to the reference voltages $V_{REFHI}$ and $V_{REFLO}$, respectively. Feedback loop 20 includes amplifier 28 and transistor 30. Feedback loop 22 includes amplifier 32 and transistor 34. The two inverter pairs 24 and 26 switch the output load $R_L$ and $C_L$, at nodes OUT+ and OUT−, between the two regulated voltages in response to the input voltages IN+ and IN−. Inverter pair 24 includes transistors 36 and 38. Inverter pair 26 includes transistors 40 and 42. Voltages $V_{REFHI}$ and $V_{REFLO}$ are created by the reference cell, shown in FIG. 2, and set the output high and low voltages.

Reference Cell

The voltage reference circuit, shown in FIG. 2, generates the reference voltages $V_{REFHI}$ and $V_{REFLO}$, that set the output high and low voltages for the output driver in FIG. 1. These reference levels are set as a fraction of the supply voltage $V_{DD}$; as a result, both the output differential and common-mode are functions of the supply voltage $V_{DD}$. The sizes of transistors 50 and 52 are chosen such that the majority of the supply voltage is dropped across the resistors 54, 56, and 58 in the reference cell. By minimizing the voltage drop across transistors 50 and 52 in the reference generator with respect to supply voltage $V_{DD}$, the reference levels are largely independent of any process variation in both the sheet resistance and the transistor strength. However, by including the transistors 50 and 52 in the reference cell, the voltage drop across the transistors 36, 38, 40 and 42 in the output driver is cancelled. Since process effects are minimized, the resistors 54, 56, and 58 can be implemented using nwell resistors, which are available in any standard CMOS process. The actual reference voltage $V_{REFHI}$ and $V_{REFLO}$ levels can be programmable, which are used to partially provide the signal pre-equalization described below. Resistor 56 is nominally a scaled up version of the load resistor RL. Resistors 54 and 58 are chosen to set the voltages at nodes VH and VL, which are the desired output high and low voltages, respectively. These can be set such that the output signaling characteristics are compatible with existing standards such as LVDS or PECL. (LVDS is the TIA/EIA-644 standard for "Electrical Characteristics of Low Voltage Differential Signaling Interface Circuits." LVDS is commonly used in high-speed backplane designs as the signaling standard. Output voltage is 247 mv to 454 mv differential with a common-mode of 1.125V to 1.375V.) (PECL is "Positive Emitter Coupled Logic", a commonly used signaling standard for high-speed bipolar (emitter) logic devices. It is also differential with an output swing ranging from 600 mV to 1100 mV with a common-mode of approximately VDD-1.3V. Since it uses the bipolar emitter as its output device, the output impedance is very low. This is difficult to mimic with a typical CMOS driver and impossible with CML.)

Edge Emphasis

Figure 3:
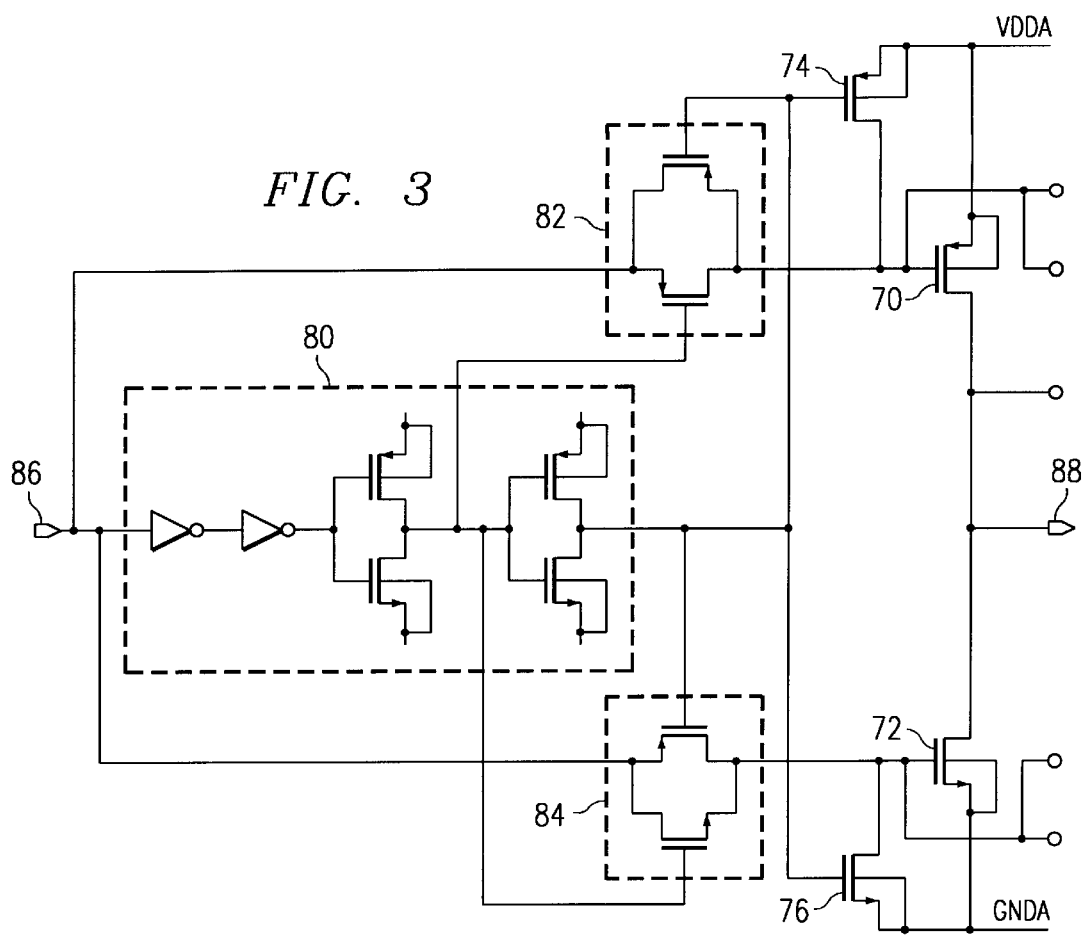
FIGS. 3 and 4 are a schematic circuit diagrams of preferred embodiment edge emphasis circuits.
Figure 4:
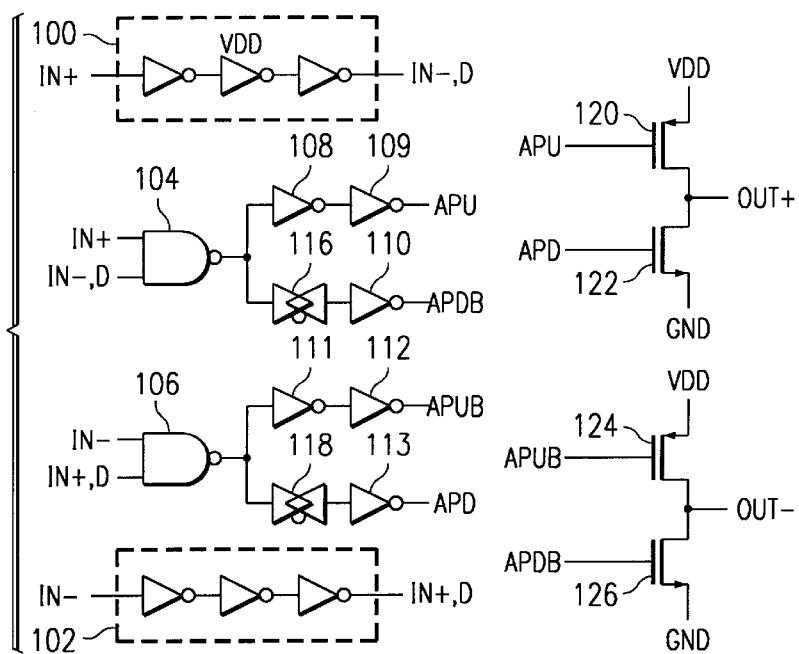

The edge emphasis circuits shown in FIGS. 3 and 4 provide additional pull-up or pull-down current during signal transitions, 1→0 or 0→1, to reduce the rise and fall times when driving a capacitive load. FIGS. 3 and 4 illustrate two techniques for accomplishing this. The circuit of FIG. 3 includes active pull-up and active pull-down to provide symmetric rise and fall time emphasis. The circuit of FIG. 3 includes transistors 70, 72, 74, and 76; inverter chain 80; pass devices 82 and 84; input node 86; output node 88; supply VDDA; and ground GNDA. Only one half of the circuit is shown; identical circuits would be connected to the true and complement outputs out+ and out− shown in FIG. 1. During any transition, transistor 70 sources current to the output node 88 when it is switching high and transistor 72 sinks current from the output node 88 when it switches low. The length of time that pull-up and pull-down currents are provided to the outputs is set by the delay through the inverter chain 80. This compensates for process variations, since if a variation in transistor fabrication causes the strength of the pull-up/pull-down devices to get weaker (stronger), the inverter delay becomes longer (shorter). The net current sourced or sunk from node 88 is approximately constant.

Figure 5:
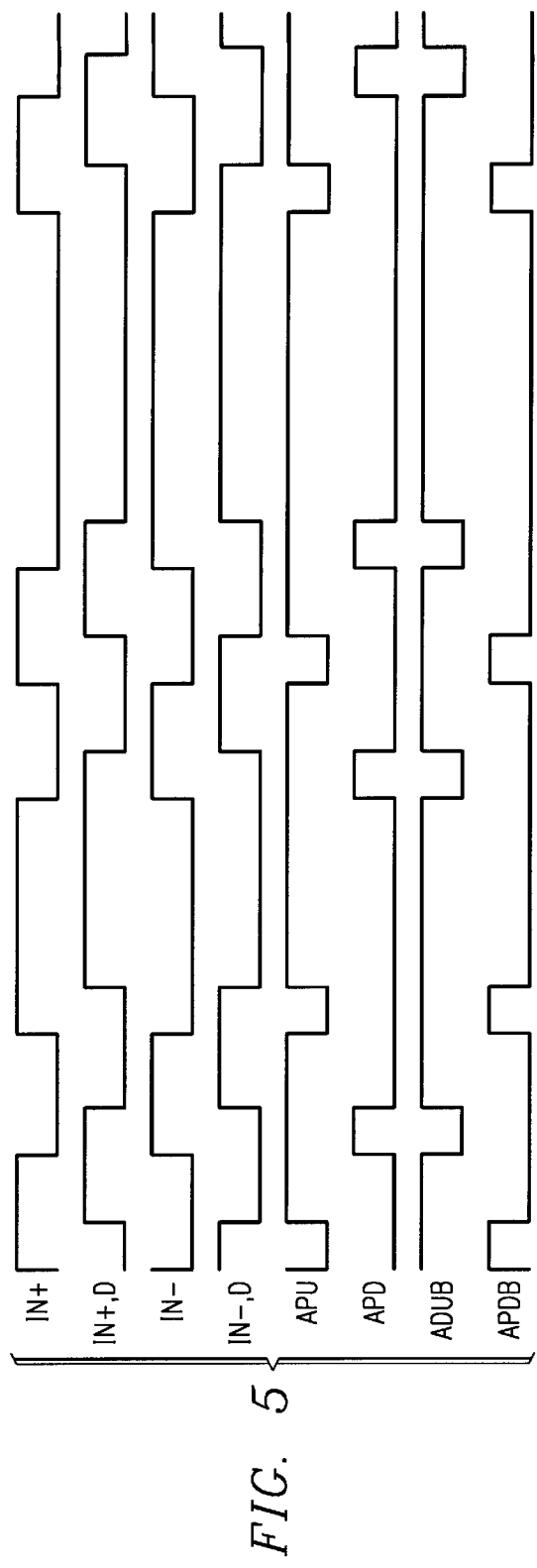
FIG. 5 is a plot of sample signals for the edge-emphasis circuit shown in FIG. 4.

FIG. 4 illustrates a better technique for implementing the edge-emphasis that uses a one-shot structure for the edge-emphasis rather than the pass-gate shown in FIG. 3. The circuit of FIG. 4 includes inverter chains 100 and 102; nand gates 104 and 106; inverters 108–113; pass gates 116 and 118; and transistors 120, 122, 124, and 126. Inputs IN+ and IN− are the inputs shown in FIG. 1. Outputs out+ and out− are the outputs shown in FIG. 1. The functionality is similar to that in FIG. 3, but this circuit has the advantage that the duration that edge-emphasis is being turned on is programmable in inverter delays of 1,2,3,4 . . . , while the pass-gate version can only delay in increments of 2,4,6 . . . inverter delays. This provides finer granularity of the edge-emphasis. FIG. 5 is a plot of sample signals for the edge-emphasis circuit shown in FIG. 4.

Programmable Pre-Emphasis

Figure 6:
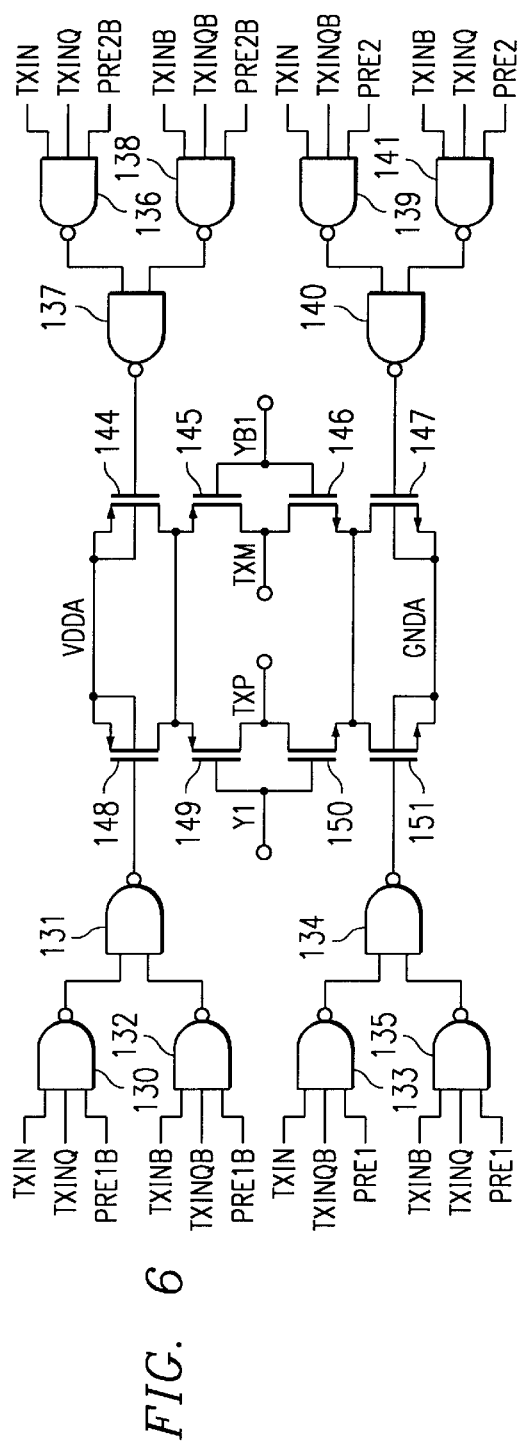
FIG. 6 is a schematic circuit diagram of a preferred embodiment pre-emphasis circuit.

The pre-emphasis circuit shown in FIG. 6 provides a programmable solution for boosting the high-frequency content of the transmitted data. In data transmission systems where data of various run-lengths is being transmitted over a lossy media, the high frequency information in the signal is attenuated due to the skin effect. This causes a reduction in the timing margins of the downstream receiver since short run-lengths, which consist of high frequency data, are attenuated. This phenomenon is known as intersymbol interference.

The circuit of FIG. 6 includes nand gates 130–141; transistors 144–151; inputs TXIN, TXINB, TXINQ, TXINQB, PRE1, PRE1B, PRE2, PRE2B, Y1, and YB1; and outputs TXP and TXM. TXIN is IN+ minus several buffer delays. Y1 is IN+ and YB1 is IN−. TXP is OUT+ and TXM is OUT−. IN+, IN−, OUT+ and OUT− are the input and output nodes shown in FIG. 1. TXINB is IN− minus several buffer delays. TXINQ is IN+ delayed by a single bit. TXINQB is IN-delayed by a single bit. PRE1 and PRE2 select the level of pre-emphasis. PRE1B and PRE2B are the inverse of PRE1 and PRE2, respectively. For PRE=0 and PRE2=0, there is no pre-emphasis and devices 144, 147, 148 and 151 are "off". For PRE1=0 and PRE2=1, the first level of pre-emphasis is "on", with devices 144 and 147 "on" and devices 148 and 151 "off". For PRE1=1 and PRE2=0, the second level of pre-emphasis is "on", with devices 148 and 151 "on" and devices 144 and 147 "off". For PRE1=1 and PRE2=1, the third level of pre-emphasis is "on", with devices 144, 147, 148, and 151 "on".

FIG. 6 illustrates a circuit that boosts the amplitude of single run-length data. A single cycle delayed version of the input data of the output driver is required. Whenever a transition in the output data is detected, devices 149, 145, 150, and 146 are connected in parallel between the primary output driver and Vdd for a full bit time, increasing the amplitude of the single run-length bit. The amount of pre-emphasis is programmable by sizing the switch devices 148, 144, 151, and 147. In addition, the voltage-reference cell of FIG. 2 is programmed to provide a reduced level to de-emphasize during run-lengths longer than one.

The preferred embodiment solution uses an inexpensive standard CMOS process and is compatible with existing standards such as PECL and LVDS. The proposed solution is also lower power than comparable CML or source-follower solutions with similar output swings.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A differential output driver comprising:
   a first inverter having a positive input node and a negative output node, the first inverter is coupled to a positive power supply node and a negative power supply node;

a second inverter having a negative input node and a positive output node, the second inverter is coupled to the positive power supply node and the negative power supply node;

a first feedback loop for regulating the positive power supply node;

a second feedback loop for regulating the negative power supply node;

a first edge emphasis circuit coupled to the positive output node; and a second edge emphasis circuit coupled to the negative output node.

2. The circuit of claim 1 wherein the first feedback loop comprises:

a first transistor coupled between a first voltage supply node and the positive power supply node;

a first amplifier having an output coupled to a control node of the first transistor;

a first input of the first amplifier coupled to the positive power supply node; and a second input of the first amplifier coupled to a first reference node.

3. The circuit of claim 2 wherein the second feedback loop comprises:

a second transistor coupled between a second voltage supply node and the negative power supply node;

a second amplifier having an output coupled to a control node of the second transistor;

a first input of the second amplifier coupled to the negative power supply node; and a second input of the second amplifier coupled to a second reference node.

4. The circuit of claim 3 further comprising a reference circuit coupled to the first and second reference nodes.

5. The circuit of claim 4 wherein the reference circuit comprises:

a first transistor coupled to the first reference node;

a first resistor coupled between the first reference node and the first voltage supply node;

a second transistor coupled to the second reference node;

a second resistor coupled between the first and second transistors; and a third resistor coupled between the second reference node and the second voltage supply node.

6. The circuit of claim 1 wherein the first edge emphasis circuit comprises:

an active pull-up coupled to the positive output node; and an active pull-down coupled to the positive output node.

7. The circuit of claim 1 wherein the second edge emphasis circuit comprises:

an active pull-up coupled to the negative output node; and an active pull-down coupled to the negative output node.

8. A differential driver comprising:

a first inverter for driving a positive differential output;

a second inverter for driving a negative differential output;

a first feedback loop for regulating a first power supply for the first and second inverters;

a second feedback loop for regulating a second power supply for the first and second inverters;

a reference circuit for providing a first reference voltage to the first feedback loop and a second reference voltage to the second feedback loop;

a first edge emphasis circuit coupled to the positive differential output; and a second edge emphasis circuit coupled to the negative differential output.

9. The circuit of claim 8 wherein the first feedback loop comprises:

a first transistor coupled between a first voltage supply node and a first power supply node for the first and second inverters;

a first amplifier having an output coupled to a control node of the first transistor;

a first input of the first amplifier coupled to the first power supply node; and a second input of the first amplifier coupled to a first reference node.

10. The circuit of claim 9 wherein the second feedback loop comprises:

a second transistor coupled between a second voltage supply node and a second power supply node for the first and second inverters;

a second amplifier having an output coupled to a control node of the second transistor;

a first input of the second amplifier coupled to the second power supply node; and a second input of the second amplifier coupled to a second reference node.

11. The circuit of claim 10 wherein the reference circuit is coupled to the first and second reference nodes.

12. The circuit of claim 11 wherein the reference circuit comprises:

a first transistor coupled to the first reference node;

a first resistor coupled between the first reference node and the first voltage supply node;

a second transistor coupled to the second reference node;

a second resistor coupled between the first and second transistors; and a third resistor coupled between the second reference node and the second voltage supply node.

13. The circuit of claim 8 wherein the first edge emphasis circuit comprises:

an active pull-up coupled to the positive differential output; and an active null-down coupled to the positive differential output.

14. The circuit of claim 8 wherein the second edge emphasis circuit comprises:

an active pull-up coupled to the negative differential output; and an active pull-down coupled to the negative differential output.

* * * * *